United States Patent
Yang et al.

(10) Patent No.: US 10,312,108 B2
(45) Date of Patent: Jun. 4, 2019

(54) METHOD FOR FORMING SEMICONDUCTOR STRUCTURE USING MODIFIED RESIST LAYER

(71) Applicant: Taiwan Semiconductor Manufacturing Co., Ltd., Hsinchu (TW)

(72) Inventors: Li-Po Yang, Hsinchu (TW); Chien-Wei Wang, Zhubei (TW); Wei-Han Lai, New Taipei (TW); Chin-Hsiang Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 6 days.

(21) Appl. No.: 15/480,976

(22) Filed: Apr. 6, 2017

(65) Prior Publication Data

US 2018/0292752 A1    Oct. 11, 2018

(51) Int. Cl.
| | | |
|---|---|---|
| *H01L 21/02* | (2006.01) | |
| *H01L 21/311* | (2006.01) | |
| *G03F 7/075* | (2006.01) | |
| *G03F 7/40* | (2006.01) | |
| *H01L 21/027* | (2006.01) | |

(52) U.S. Cl.
CPC ...... *H01L 21/31144* (2013.01); *G03F 7/0752* (2013.01); *G03F 7/405* (2013.01); *H01L 21/0273* (2013.01)

(58) Field of Classification Search
CPC .......... G03F 7/0755; G03F 7/20; G03F 7/038; G03F 7/38; G03F 7/16; G03F 7/325; G03F 7/11; G03F 7/162; H01L 21/31144; H01L 21/31116; H01L 21/0274; H01L 21/823857; H01L 21/823842; H01L 21/34; H01L 27/0922; H01L 29/4966; H01L 27/0886; H01L 29/785; H01L 21/823828; H01L 21/828857; H01L 29/401; H01L 27/1211
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |

(Continued)

*Primary Examiner* — Moin M Rahman
(74) *Attorney, Agent, or Firm* — Birch, Stewart, Kolasch & Birch, LLP

(57) ABSTRACT

Methods for forming a semiconductor structure are provided. The method for forming a semiconductor structure includes forming a material layer over a substrate and forming a resist layer over the material layer. The method for forming a semiconductor structure further includes exposing the resist layer to form an exposed portion of the resist layer and forming a treating material layer over the exposed portion and an unexposed portion of the resist layer. In addition, a top surface of the exposed portion of the resist layer reacts with the treating material layer. The method for forming a semiconductor structure further includes removing the treating material layer and removing the unexposed portion of the resist layer to form an opening in the resist layer after the treating material is removed.

20 Claims, 7 Drawing Sheets

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2005/0277064 A1* | 12/2005 | Lamarre ............... G03F 7/0035 430/312 |
| 2008/0220616 A1* | 9/2008 | Matsui .............. H01L 21/31133 438/736 |
| 2013/0171574 A1* | 7/2013 | Xu ........................... G03F 7/38 430/325 |

\* cited by examiner

METHOD FOR FORMING SEMICONDUCTOR STRUCTURE USING MODIFIED RESIST LAYER

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher level of integration of circuits. This is accomplished by miniaturizing or shrinking device sizes on a given chip. However, as the device sizes shrink, lithography processes used to form the devices also become more and more challenging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
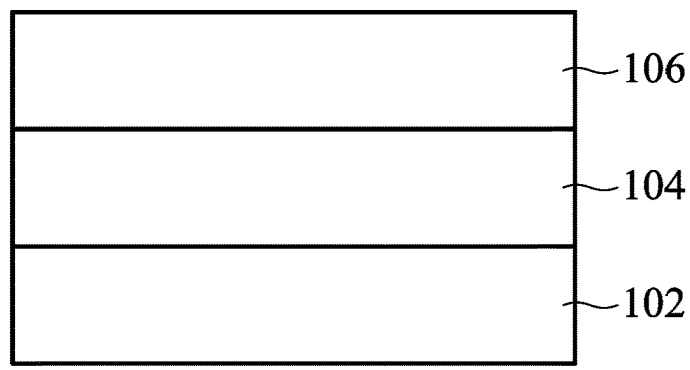
FIGS. 1A to 1F are cross-sectional representations of various stages of forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of methods for forming semiconductor structures are provided. The method may include exposing a resist layer formed over a material layer and forming a treating material layer over a top surface of the exposed portion of the resist layer. By forming the treating material layer over the top surface of the exposed portion of the resist layer, the top surface of the exposed portion of the resist layer can be modified, so that an etching selectivity between the modified exposed portion of the resist layer and the material layer can be improved during a subsequent etching process.

FIGS. 1A to 1F are cross-sectional representations of various stages of forming a semiconductor structure 100 in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In some embodiments, the substrate 102 includes structures such as doped regions including wells and source/drain regions, isolation features including shallow trench isolation (STI), inter-level dielectric (ILD) layers, and/or conductive features including gate electrodes, metal lines, vias, and contacts.

A material layer 104 is formed over the substrate 102, as shown in FIG. 1A in accordance with some embodiments. The material layer 104 is configured to be patterned in subsequent manufacturing processes. The material layer 104 may include one or more material layers.

In some embodiments, the material layer 104 is a dielectric layer. In some embodiments, the material layer 104 is made of metal oxides, metal nitrides, metal silicates, transition metal-oxides, transition metal-nitrides, transition metal-silicates, or oxynitrides of metals. Examples of materials used to form the material layer 104 include, but are not limited to, titanium oxide, titanium nitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, the material layer 104 is made of low-k dielectric materials. In some embodiments, the material layer 104 is made of silicon oxide, silicon nitride, silicon oxynitride, phosphosilicate glass (PSG), borophosphosilicate glass (BPSG), and/or other applicable low-k dielectric materials.

In some embodiments, the material layer 104 is formed by performing a chemical vapor deposition (CVD) process, a physical vapor deposition (PVD) process, an atomic layer deposition (ALD) process, a spin-on coating process, or other applicable processes.

After the material layer 104 is formed, a resist layer 106 is formed over the material layer 104, as shown in FIG. 1A in accordance with some embodiments. In some embodiments, the resist layer 106 is a negative photoresist layer. In some embodiments, when a portion of the resist layer 106 exposed to radiation (e.g. light), the exposed portion will become insoluble or less soluble in a developer used afterwards, while an unexposed portion of the resist layer 106 will remain soluble in the developer.

In some embodiments, the resist layer 106 is formed by coating a resist material over the material layer 104. In some embodiments, the resist material used to form the resist layer 106 includes photosensitive polymers. The photosensitive polymers may be soluble in a developer used in a developing process before being exposed but become less soluble or insoluble in the developer after being exposed. In some embodiments, the resist material used to form the resist layer 106 further includes a photoacid generator (PAG), a quencher, and a solvent.

Figure 1B:
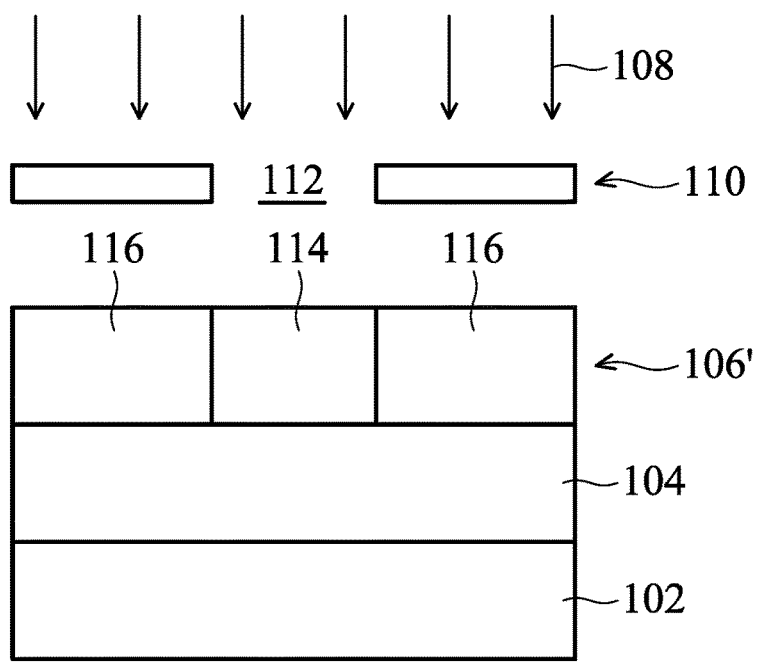

After the resist layer 106 is formed, an exposure process 108 is performed on the resist layer 106 to form a patterned resist layer 106', as shown in FIG. 1B in accordance with some embodiments. More specifically, a mask structure 110 with an opening 112 is positioned over the resist layer 106 during the exposure process 110, so that a portion of the resist layer 106 is exposed through the opening 112 of the mask structure 110, and the patterned resist layer 106' therefore has an exposed portion 114 and unexposed portions 116.

During the exposure process 108, the exposed portion 114 of the resist material may be converted to have acid groups therein, so that the exposed portion 114 of the patterned resist layer 106' becomes insoluble or less soluble in the developer used afterwards, compared to the unexposed portion 116 of the patterned resist layer 106'. After the exposure process 108 is performed, the mask structure 110 is removed.

Next, the patterned resist layer 106' is baked (e.g. heated) in accordance with some embodiments. In some embodiments, the amount of acid groups (e.g. —COOH group) in the exposed portion 114 of the patterned resist layer 106' increases after the patterned resist layer 106' is baked, so that the exposed portion 114 become even less soluble than before it is baked.

Figure 1C:
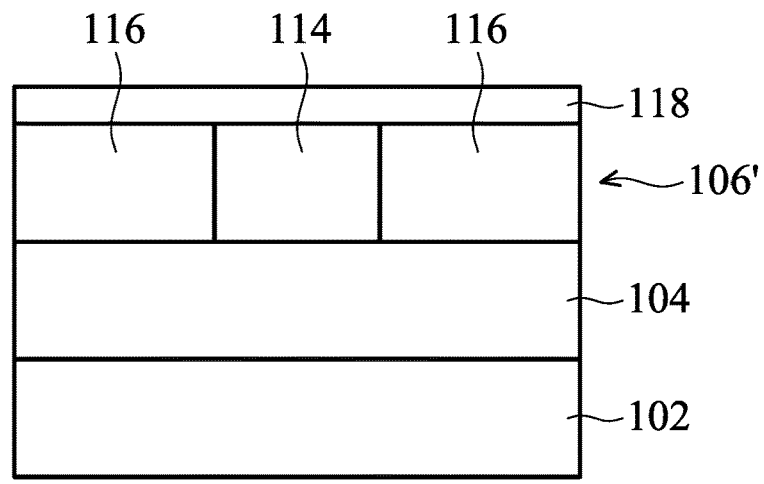

After the patterned resist layer 106' is baked, a treating material layer 118 is formed over the patterned resist layer 106', as shown in FIG. 1C in accordance with some embodiments. The treating material layer 118 may be formed by performing a spin-coating process.

In some embodiments, the treating material layer 118 is formed over both the top surfaces of the exposed portion 114 and the unexposed portions 116 of the patterned resist layer 106'. The formation of the treating material layer 118 is configured to modify the top surface of the exposed portion 114 of the patterned resist layer 106', so that the etching selectivity between the exposed portion 114 of the patterned resist layer 106' and the material layer 104 below the patterned resist layer 106' may be improved during a subsequent etching process (Details will be described later).

In some embodiments, the treating material layer 118 includes a treating compound. In some embodiments, the treating compound reacts with the top surface of the exposed portion 114 of the patterned resist layer 106' in an acid-base reaction. In some embodiments, the treating compound is a silicon-containing compound. In some embodiments, the treating compound includes about 5 wt % to about 46 wt % of Si. The weight percentage of Si in the treating compound should be great enough that etching selectivity of the modified exposed portion 114 of the patterned resist layer 106' during a subsequent etching process can be improved.

In some embodiments, the treating compound is a silicon-containing compound with an amine group, which is configured to bond with the acid group at the top surface of the exposed portion 114 of the patterned resist layer 106'. In some embodiments, the treating compound has the following formula:

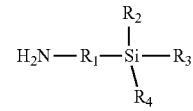

In some embodiments, $R_1$ is $C_1$-$C_{20}$ alkyl, $C_2$-$C_{20}$ alkenyl, $C_2$-$C_{20}$ alkynyl, $C_1$-$C_{20}$ alkoxy, $C_3$-$C_{20}$ cycloalkyl, $C_5$-$C_{20}$ aryl, or $C_5$-$C_{20}$ heteroaryl; $R_2$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_1$-$C_{20}$ heteroaryl; $R_3$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl; and $R_4$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl.

In some embodiments, $R_1$ is $C_1$-$C_5$ alkyl; $R_2$ is $C_1$-$C_5$ alkoxy or hydroxyl; $R_3$ is $C_1$-$C_5$ alkoxy or hydroxyl; and $R_4$ is $C_1$-$C_5$ alkoxy or hydroxyl. When $R_1$, $R_2$, $R_3$, and $R_4$ have relatively small sizes, more treating compounds may tend to bond to the exposed portion 114 of the patterned resist layer 106', and therefore the etching selectivity between the exposed portion 114 of the patterned resist layer 106' and the material layer 104 may be further improved. In some embodiments, $R_1$ is $C_1$-$C_3$ alkyl and $R_2$ is —OMe, —OEt, or —OH. In addition, $R_3$ and $R_4$ are the same as $R_2$.

Figure 2:
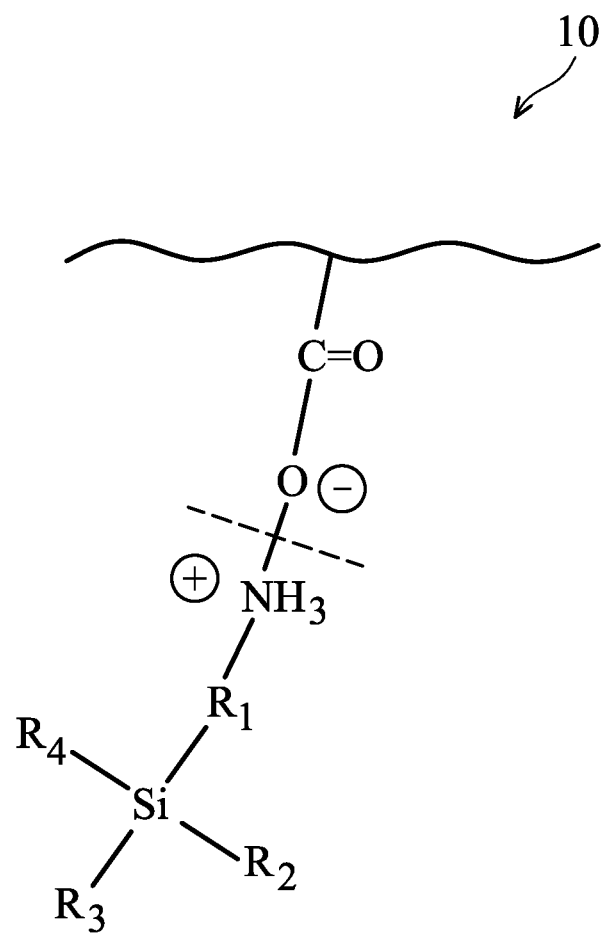
FIG. 2 illustrates a treating compound bonding to a photoresist polymer in the resist layer in accordance with some embodiments.

FIG. 2 illustrates a treating compound bonding to a photosensitive polymer 10 in the exposed portion 114 in accordance with some embodiments. As shown in FIG. 2, an acid group at the photosensitive polymer 10 in the exposed portion 114 reacts with the amine group to form a covalent bond therebetween, so that the surface of the exposed portion 114 of the patterned resist layer 106' in contact with the treating material layer 118 is modified by the treating compounds.

In some embodiments, the molecular weight of the treating compound is in a range from about 100 to about 10000. In some embodiments, the molecular weight of the treating compound is in a range from about 100 to about 300. The molecular weight of the treating compound may be relative small, so that more treating compounds may tend to bond to the top surface of the exposed portion 114 of the patterned resist layer 106'.

In some embodiments, the treating compound is dissolved in an organic solvent. The organic solvent may include n-butyl acetate (NBA) or isoamyl acetate (IAA). In some embodiments, the treating material layer further includes less than about 10% of isobutyl alcohol and less than about 1% of water. In some embodiments, the concentration of the treating compound in the treating material layer 118 is in a range from about 0.001% to about 10%. The amount of the treating compound should be great enough to modify the top surface of the exposed portion 114 of the patterned resist layer 106'.

Figure 1D:
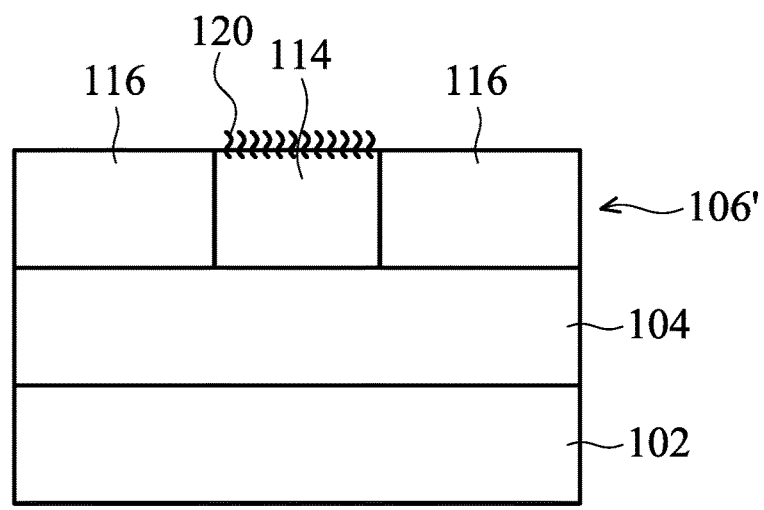

After the top portion of the exposed portion 114 of the patterned resist layer 106' is modified, the unreacted treating material layer 118 is removed, as shown in FIG. 1D in accordance with some embodiments. In some embodiments, the treating material layer 118 is removed by performing a rinsing process.

As shown in FIG. 1D, although the treating material layer 118 is removed, some treating compounds 120 bonding to the top surface of the exposed portion 114 of the patterned resist layer 106' is not removed but remains on the top surface of the exposed portion 114 of the patterned resist layer 106' in accordance with some embodiments. On the other hand, although the treating material layer 118 is also formed over the unexposed portions 116 of the patterned resist layer 106', most of the treating compounds over the unexposed portions 116 of the patterned resist layer 106' are removed when the treating material layer 118 is removed.

In some embodiments, the patterned resist layer 106' is heating in a baking process. The baking process may be performed before or after the treating material layer 118 is removed. The baking process is configured to help the treating compounds 120 to be fixed onto the top surface of the exposed portion 114 of the patterned resist layer 106', so that the etching selectivity of the modified top surface of the exposed portion 114 of the patterned resist layer 106' can be improved further.

Figure 1E:
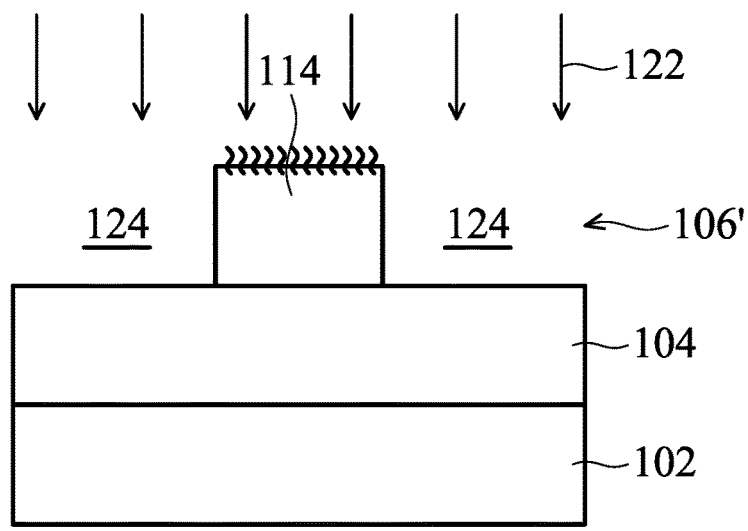

Next, a developing process 122 is performed on the patterned resist layer 106' to form openings 124, as shown in FIG. 1E in accordance with some embodiments. The unexposed portions 116 of the patterned resist layer 106' are dissolved in a developer used in the developing process 122 and are removed with the developer.

In some embodiments, the developer is an organic solvent. In some embodiments, the developer includes compounds having ester groups and/or ketone groups. In some embodiments, the developer includes 2-heptanone, n-butyl acetate, isoamyl acetate, cyclohexanone, 2-heptanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, isobutyl propionate, or combinations thereof.

As shown in FIG. 1E, during the developing process 122, the unexposed portions 116 are removed by the developer to form the openings 124 while the exposed portion 114 remains on the material layer 104 in accordance with some embodiments.

Figure 1F:
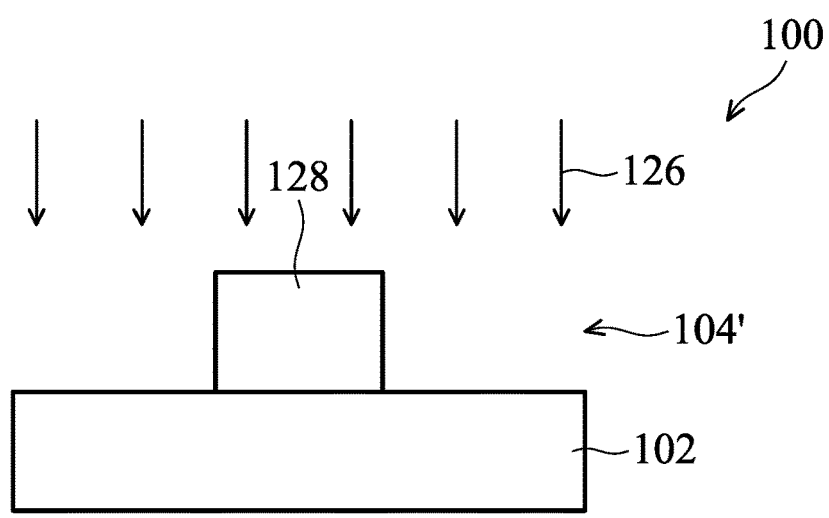

Afterwards, an etching process 126 is performed to etch the material layer 104 through the openings 124, and the patterned resist layer 106' is removed afterwards, as shown in FIG. 1F in accordance with some embodiments.

In some embodiments, the etching process 126 is a dry etching process, such as a plasma etching process. After the etching process 126 is performed, a portion 128 of the etched material layer 104' located under the exposed portion 114 of the patterned resist layer 106' remains on the substrate 102, while the portions originally located under the unexposed portions 116 are removed. The exposed portion 114 of the patterned resist layer 106' are removed after the material layer 104 is etched, and the semiconductor structure 100 is formed, as shown in FIG. 1F in accordance with some embodiments.

As described previously, the treating material layer 118 is formed over the patterned resist layer 106' to modify the surface of the patterned resist layer. When the exposed portion 114 of the patterned resist layer 106' is modified, the etching rate of the exposed portion 114 of the patterned resist layer 106' may be reduced during the etching process 122 performed afterwards, so that the etching selectivity between the exposed portion 114 of the patterned resist layer 106' and the material layer 104 in the etching process 122 can be improved.

In addition, the top surface of the exposed portion 114 is modified through a chemical reaction (e.g. an acid-base reaction). More specifically, the amine group of the treating compound reacts with the acid group at the top surface of the exposed portion 114 of the patterned resist layer 106'. Therefore, the treating material layer 118 can be formed over both the exposed portion 114 and the unexposed portions 116 of the patterned resist layer 106' before the developing process is performed but only reacts with the top surface of the exposed portion 114. Since the treating material layer 118 is formed on the top surface of the exposed portion 114 but not on the sidewalls of the exposed portion 114, the width of the exposed portion 114 will not be changed even though its top surface has been modified.

FIGS. 3A to 3E are cross-sectional representations of various stages of forming a semiconductor structure 200 in accordance with some embodiments. Some processes and materials shown in FIGS. 3A to 3E may be similar to, or the same as, those shown in FIGS. 1A to 1F and FIG. 2 and described above and are not repeated herein.

Figure 3A:
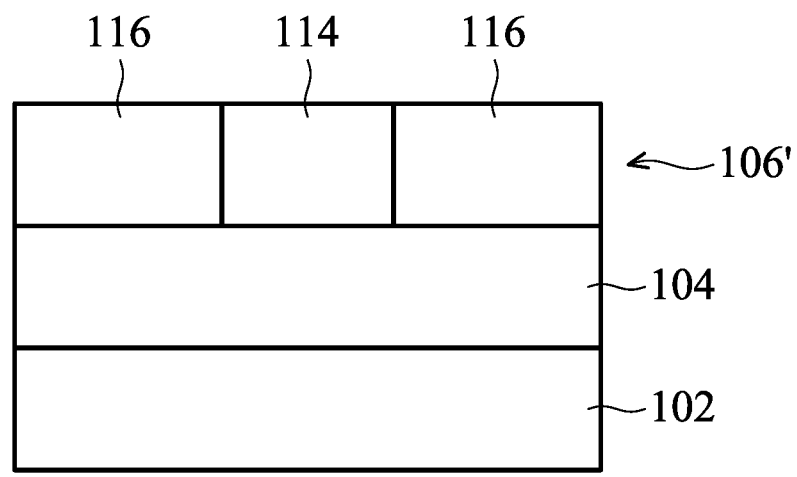
FIGS. 3A to 3E are cross-sectional representations of various stages of forming a semiconductor structure in accordance with some embodiments.

More specifically, an exposure process (e.g. the exposure process 108) may be performed to a resist layer (e.g. resist layer 106) to form a patterned resist layer 106' over the material layer 104 over the substrate 102, as shown in FIG. 3A in accordance with some embodiments. In addition, the patterned resist layer 106' includes the exposed portion 114 and the unexposed portions 116, similar to those shown in FIG. 1B and described previously.

After the exposed portion 114 of the patterned resist layer 106' is formed, the patterned resist layer 106' is baked (e.g. heated) in accordance with some embodiments. As described previously, the amount of acid groups (e.g. —COOH group) in the exposed portion 114 of the patterned resist layer 106' may increase after the patterned resist layer 106' is baked.

Figure 3B:
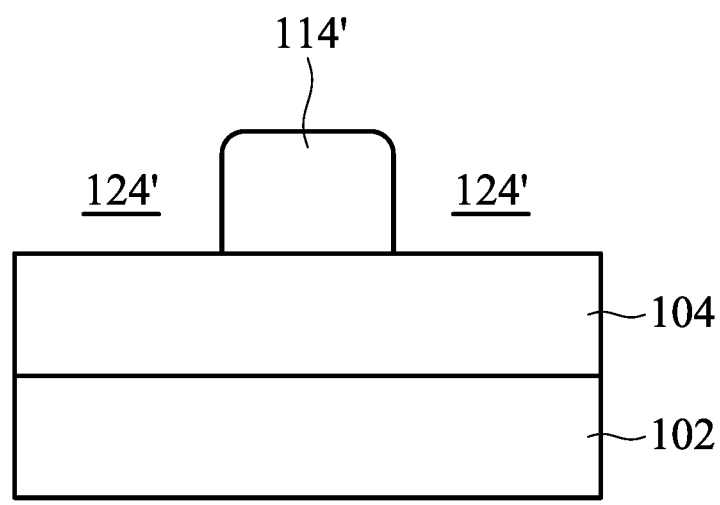

Next, a developing process is performed to remove the unexposed portions 116 of the patterned resist layer 106', as shown in FIG. 3B in accordance with some embodiments. The developing process may be similar to, or the same as, the developing process 122 described previously and are not repeated herein.

As shown in FIG. 3B, the corners of the exposed portion 114 of the patterned resist layer 106' may also be removed during the developing process, and therefore the resulting exposed portion 114' has rounded corners. During the developing process, the unexposed portions 116 are removed to form openings 124' in accordance with some embodiments.

Figure 3C:
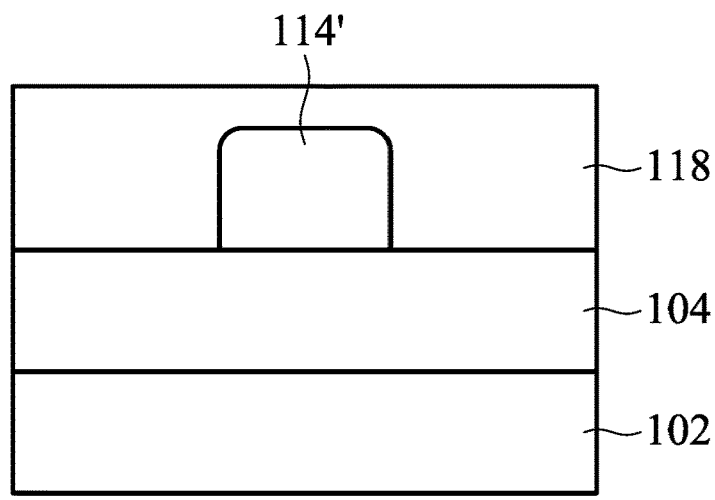

Next, a treating material layer 118' is formed over the exposed portion 114' of the patterned resist layer to modify the surface of the exposed portion 114', as shown in FIG. 3C in accordance with some embodiments. As shown in FIG. 3C, the exposed portion 114' of the patterned resist layer is completely covered by the treating material layer 118' in accordance with some embodiments. Processes and materials used to form the treating material layer 118' may similar to, or the same as, those used to form the treating material layer 118 described previously and are not repeated herein.

Figure 3D:
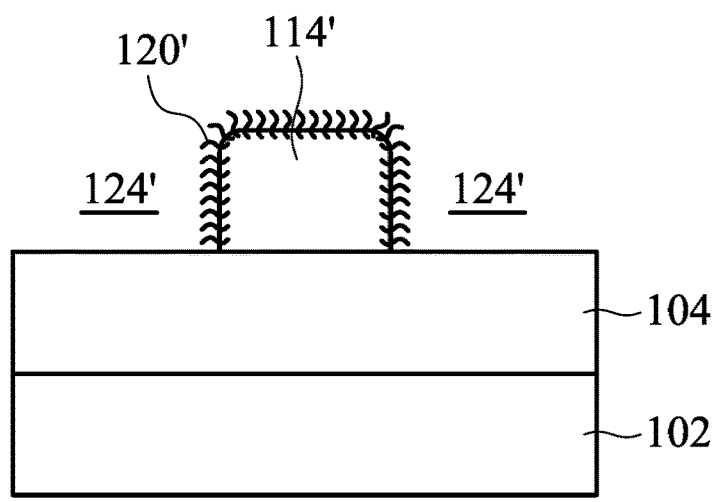

After the exposed portion 114' of the patterned resist layer is modified, the unreacted treating material layer 118' is removed, as shown in FIG. 3D in accordance with some embodiments. In some embodiments, the treating material layer 118' is removed by performing a rinsing process.

As shown in FIG. 3D, after the treating material layer 118' is removed, some treating compounds 120 bonding to the exposed portion 114' of the patterned resist layer remain on the exposed portion 114' of the patterned resist layer in accordance with some embodiments. In addition, since both the top surface and the sidewalls of the exposed portion 114' are covered by the treating material layer 118' as shown in FIG. 2C, the treating compounds 120' are bonded to both the top surface and the sidewalls of the exposed portion 114'.

In some embodiments, a baking process is performed to fix the treating compounds 120' onto the exposed portion 114'. The baking process may be performed before or after the treating material layer 118' is removed. The baking process is configured to help the treating compounds 120 bond to the top surface and the sidewalls of the exposed portion 114' of the patterned resist layer, so that the modified top surface and sidewalls of the exposed portion 114' of the patterned resist layer may have an improved etching selectivity during a subsequent etching process.

Figure 3E:
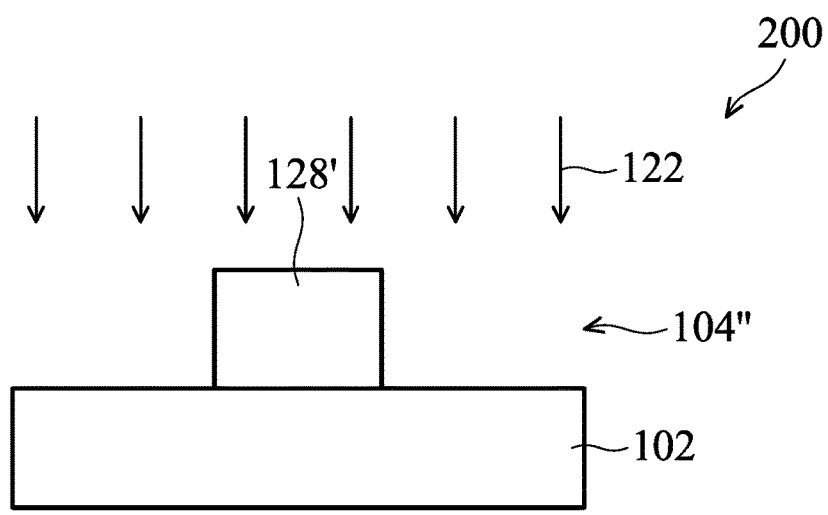

Next, the etching process 126 is performed to etch the material layer 104 through the openings 124, and the exposed portion 114' is removed afterwards, as shown in FIG. 3E in accordance with some embodiments. After the etching process 126 is performed, a portion 128' of the etched material layer 104" located under the exposed portion 114' of the patterned resist layer remains on the substrate 102, while the portions originally located under the unexposed portions 116 are removed. The exposed portion 114' of the patterned resist layer are removed after the material layer 104 is etched, and the semiconductor structure 200 is formed, as shown in FIG. 2E in accordance with some embodiments.

Generally, if a resist layer, such as a photoresist layer, is too thick, the amounts of radiation being absorbed by the upper portion and the bottom portion of the resist layer may be different, and therefore the conformity of the patterned may be undermined. On the other hand, if a resist layer is too thin, the resist layer may tend to be removed during an etching process, and therefore the pattern of the resist layer may not be able to be completely transferred to the material layer below it. Accordingly, the exposed portion (e.g. the exposed portions 114 or 114') of the patterned resist layer is modified with a treating material layer (e.g. the treating material layer 118 or 118'), such that the etching rate of the modified exposed portion can be reduced during the etching process performed afterwards (e.g. the etching process 122). Accordingly, the resist layer 106 can be relatively thin while having an improved etching selectivity during a subsequent etching process.

Furthermore, in some embodiments, the treating material layer is formed over both the exposed portion and the unexposed portions of the patterned resist layer before the developing process is performed but only reacts with the top surface of the exposed portion. Since the treating material layer is formed on the top surface of the exposed portion but not on the sidewalls of the exposed portion, the width of the exposed portion will not be changed even though its top surface has been modified.

Embodiments of methods for forming semiconductor structure are provided. The method may include modifying a top surface of an exposed portion of a resist layer, so that the etching rate of the exposed portion of the resist layer may be reduced during a subsequent etching process. Accordingly, the etching selectivity between the modified resist layer and a material layer which is designed to be etched may be improved.

In some embodiments, a method for forming a semiconductor structure is provided. The method for forming a semiconductor structure includes forming a material layer over a substrate and forming a resist layer over the material layer. The method for forming a semiconductor structure further includes exposing the resist layer to form an exposed portion of the resist layer and forming a treating material layer over the exposed portion and an unexposed portion of the resist layer. In addition, a top surface of the exposed portion of the resist layer reacts with the treating material layer. The method for forming a semiconductor structure further includes removing the treating material layer and removing the unexposed portion of the resist layer to form an opening in the resist layer after the treating material is removed.

In some embodiments, a method for forming a semiconductor structure is provided. The method for forming a semiconductor structure includes forming a material layer over a substrate and forming a resist layer having a first portion and a second portion over the material layer. The method for forming a semiconductor structure further includes exposing the first portion of the resist layer while the second portion of the resist layer remains unexposed and forming a treating material layer over the resist layer to modify a top surface of the first portion of the resist layer. The method for forming a semiconductor structure further includes removing the treating material layer and dissolving the second portion of the resist layer in a developer to form an opening after the modified first portion is formed. The method for forming a semiconductor structure further includes etching the material layer through the opening. In addition, the treating material layer comprises a silicon-containing treating compound.

In some embodiments, a method for forming a semiconductor structure is provided. The method for forming a semiconductor structure includes forming a material layer over a substrate and forming a resist layer over the material layer. The method for forming a semiconductor structure further includes exposing a first portion of the resist layer and reacting a treating compound with a top surface of the first portion of the resist layer to form a modified first portion of the resist layer. In addition, the treating compound has the following formula:

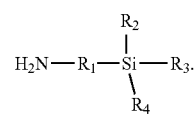

$R_1$ is $C_1$-$C_{20}$ alkyl, $C_2$-$C_{20}$ alkenyl, $C_2$-$C_{20}$ alkynyl, $C_1$-$C_{20}$ alkoxy, $C_3$-$C_{20}$ cycloalkyl, $C_5$-$C_{20}$ aryl, or $C_5$-$C_{20}$ heteroaryl; $R_2$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl; $R_3$ is alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl; and $R_4$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a material layer over a substrate;
   forming a resist layer over the material layer;
   exposing the resist layer to form an exposed portion of the resist layer;
   forming a treating material layer over the exposed portion and an unexposed portion of the resist layer, wherein a top surface of the exposed portion of the resist layer reacts with the treating material layer to form a modified exposed portion;
   removing the treating material layer; and
   removing the unexposed portion of the resist layer to form an opening in the resist layer after the treating material is removed.

2. The method for forming a semiconductor structure as claimed in claim 1, wherein the treating material layer comprises a treating compound, and the treating compound bonds to the top surface of the exposed portion of the resist layer through an amine group.

3. The method for forming a semiconductor structure as claimed in claim 1, wherein the treating layer comprises a treating compound having the following formula:

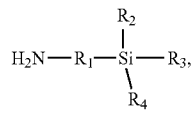

wherein $R_1$ is $C_1$-$C_{20}$ alkyl, $C_2$-$C_{20}$ alkenyl, $C_2$-$C_{20}$ alkynyl, $C_1$-$C_{20}$ alkoxy, $C_3$-$C_{20}$ cycloalkyl, $C_5$-$C_{20}$ aryl, or $C_5$-$C_{20}$ heteroaryl;
$R_2$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl;
$R_3$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl; and
$R_4$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl.

4. The method for forming a semiconductor structure as claimed in claim 1, wherein the treating material layer comprises a silicon-containing treating compound, and the silicon-containing treating compound comprises about 5 wt % to about 46 wt % of Si.

5. The method for forming a semiconductor structure as claimed in claim 1, wherein the step of removing the unexposed portion of the resist layer to form an opening in the resist layer comprises:
   dissolving the unexposed portion of the resist layer in a developer.

6. A method for forming a semiconductor structure, comprising:
   forming a material layer over a substrate;
   forming a resist layer having a first portion and a second portion over the material layer;
   exposing the first portion of the resist layer while the second portion of the resist layer remains unexposed;
   forming a treating material layer over the resist layer to modify a top surface of the first portion of the resist layer;
   removing the treating material layer;
   dissolving the second portion of the resist layer in a developer to form an opening after the modified first portion is formed; and
   etching the material layer through the opening,
   wherein the treating material layer comprises a silicon-containing treating compound.

7. The method for forming a semiconductor structure as claimed in claim 6, further comprising:
   baking the resist layer after the first portion of the resist layer is exposed.

8. The method for forming a semiconductor structure as claimed in claim 7, further comprising:
   baking the resist layer after the treating material layer is formed.

9. The method for forming a semiconductor structure as claimed in claim 6, wherein the silicon-containing treating compound reacts with the top surface of the first portion of the resist layer in an acid-base reaction.

10. The method for forming a semiconductor structure as claimed in claim 6, wherein the silicon-containing treating compound has the following formula:

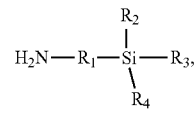

wherein $R_1$ is $C_1$-$C_{20}$ alkyl, $C_2$-$C_{20}$ alkenyl, $C_2$-$C_{20}$ alkynyl, $C_1$-$C_{20}$ alkoxy, $C_3$-$C_{20}$ cycloalkyl, $C_5$-$C_{20}$ aryl, or $C_5$-$C_{20}$ heteroaryl;
$R_2$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl;
$R_3$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl; and
$R_4$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl.

11. The method for forming a semiconductor structure as claimed in claim 10, wherein the amine group in the silicon-containing treating compound reacts with an acid group at the top surface of the first portion of the resist layer when the treating material layer is formed over the resist layer.

12. The method for forming a semiconductor structure as claimed in claim 6, wherein the silicon-containing treating compound comprises about 5 wt % to about 46 wt % of Si.

13. A method for forming a semiconductor structure, comprising:
forming a material layer over a substrate;
forming a resist layer over the material layer;
exposing a first portion of the resist layer;
reacting a treating compound with a top surface of the first portion of the resist layer to form a modified first portion of the resist layer,
wherein the treating compound has the following formula:

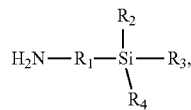

wherein $R_1$ is $C_1$-$C_{20}$ alkyl, $C_2$-$C_{20}$ alkenyl, $C_2$-$C_{20}$ alkynyl, $C_1$-$C_{20}$ alkoxy, $C_3$-$C_{20}$ cycloalkyl, $C_5$-$C_{20}$ aryl, or $C_5$-$C_{20}$ heteroaryl;
$R_2$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl;
$R_3$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl; and
$R_4$ is $C_1$-$C_{20}$ alkoxy, hydroxyl, hydrogen, $C_1$-$C_{20}$ alkyl, $C_2$-$C_{20}$ alkenyl, $C_2$-$C_{20}$ alkynyl, $C_3$-$C_{20}$ cycloalkyl, $C_5$-$C_{20}$ aryl, or $C_4$-$C_{20}$ heteroaryl.

14. The method for forming a semiconductor structure as claimed in claim 13, wherein the treating compound bonds to the top surface of the first portion of the resist layer through its amine group.

15. The method for forming a semiconductor structure as claimed in claim 13, wherein $R_1$ is $C_1$-$C_5$ alkyl, $R_2$, $R_3$, and $R_4$ are $C_1$-$C_5$ alkoxy or hydroxyl.

16. The method for forming a semiconductor structure as claimed in claim 13, wherein a molecular weight of the treating compound is in a range from about 100 to about 10000.

17. The method for forming a semiconductor structure as claimed in claim 13, further comprising:
removing an unexposed portion of the resist layer after the modified first portion of the resist layer is formed.

18. The method for forming a semiconductor structure as claimed in claim 13, further comprising:
removing an unexposed portion of the resist layer before the modified first portion of the resist layer is formed, such that the treating compound also reacts with sidewalls of the first portion of the resist layer.

19. The method for forming a semiconductor structure as claimed in claim 13, wherein the step of reacting a treating compound with a top surface of the first portion of the resist layer comprises
coating a treating material layer over the resist layer; and
removing the treating material layer after the modified first portion of the resist layer is formed,
wherein the treating material layer comprises the treating compound, and a concentration of the treating compound in the treating material layer is in a range from about 0.001 wt % to about 10 wt %.

20. The method for forming a semiconductor structure as claimed in claim 1, further comprising;
etching the material layer through the opening of the resist layer; and
removing the exposed portion of the resist layer after the material layer is etched.

* * * * *